(12) United States Patent
Lee

(10) Patent No.: US 7,289,591 B2
(45) Date of Patent: Oct. 30, 2007

(54) COUNTER CIRCUIT FOR CONTROLLING OFF-CHIP DRIVER

(75) Inventor: Kang Youl Lee, Cheongju-Si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 97 days.

(21) Appl. No.: 11/160,832

(22) Filed: Jul. 12, 2005

(65) Prior Publication Data

US 2006/0120504 A1    Jun. 8, 2006

(30) Foreign Application Priority Data

Dec. 6, 2004    (KR) .................. 10-2004-0101782

(51) Int. Cl.
*H03K 21/00* (2006.01)
(52) U.S. Cl. ........................ 377/33; 327/108
(58) Field of Classification Search .................. None
See application file for complete search history.

(56) References Cited

U.S. PATENT DOCUMENTS

| | | | | |
|---|---|---|---|---|
| 4,592,057 A | * | 5/1986 | Comerford | ............. 372/8 |
| 4,687,970 A | * | 8/1987 | Musslyn et al. | ............. 315/106 |
| 5,232,294 A | * | 8/1993 | Inui | ............. 400/120.09 |
| 5,241,265 A | * | 8/1993 | McDonnell et al. | ............. 714/726 |
| 5,270,632 A | * | 12/1993 | Hirota et al. | ............. 318/799 |
| 5,714,984 A | * | 2/1998 | Fukuzaki et al. | ............. 345/174 |
| 5,869,959 A | * | 2/1999 | Tomikawa | ............. 324/76.27 |
| 6,094,075 A | | 7/2000 | Garrett, Jr. et al. | |
| 6,294,934 B1 | | 9/2001 | Garrett, Jr. et al. | |
| 6,313,674 B1 | | 11/2001 | Akita et al. | |
| 6,337,834 B1 | | 1/2002 | Isobe et al. | |
| 6,373,286 B1 | | 4/2002 | Loeffler et al. | |
| 6,459,539 B1 | | 10/2002 | Carlson et al. | |
| 6,870,419 B1 | | 3/2005 | Garrett, Jr. et al. | |
| 2003/0107541 A1 | * | 6/2003 | Naiki | ............. 345/87 |

FOREIGN PATENT DOCUMENTS

| | | | |
|---|---|---|---|
| JP | 62-176219 | * | 8/1987 |
| JP | 1-280924 | * | 11/1989 |
| JP | 4-239819 | | 8/1992 |
| JP | 2000-174614 | * | 6/2000 |
| JP | 2000-251473 | | 9/2000 |
| JP | 2003-69419 | * | 3/2003 |
| KR | 20010048985 | | 6/2001 |
| KR | 20020037605 | | 5/2002 |

* cited by examiner

*Primary Examiner*—Tuan T Lam
(74) *Attorney, Agent, or Firm*—Marshall Gerstein Borun LLP

(57) ABSTRACT

Disclosed herein is a counter circuit for controlling an off-chip driver, wherein hexadecimal number counting is performed using a N (N is a natural number) number of T-flip-flops. The plurality of the T-flip-flops performs a hexadecimal number counting operation to generate 4-bit, 5-bit and 6-bit off-chip driver control signals having a logic value of 16, 32 or 64. A plurality of counting controllers controls the counting operation of the T-flip-flops to increase or decrease the logic value of the control signals for controlling the off-chip driver.

18 Claims, 5 Drawing Sheets

Decrease condition :
if (DEC & C8(n−1)='0')
then C7(n)<='0';

← Default

Increase condition :
if (INC & C6(n−1)='1')
then C7(n)<='1';

COUNTER CIRCUIT FOR CONTROLLING OFF-CHIP DRIVER

FIELD OF THE INVENTION

The present invention relates to a semiconductor memory device, and more specifically, to a counter circuit for controlling an off-chip driver of a semiconductor memory device.

DISCUSSION OF RELATED ART

An off-chip driver called an output driver is a circuit that drives an output node in a predetermined output voltage level in order to transmit data from a semiconductor chip to the outside.

FIG. 1 is a circuit diagram of a counter circuit for controlling an off-chip driver in the prior art.

Referring to FIG. 1, the counter circuit for controlling the off-chip driver includes fifteen SR flip-flops 101 to 115, and fifteen counting controllers 121 to 135.

Each of the SR flip-flops 101 to 115 outputs a logic high level to an output terminal Q through a set input terminal S, and a logic low level to the output terminal Q through a reset input terminal R to generate an off-chip driver control signals OCD<0:14>. These SR flip-flops 101 to 115 produces a predetermined initial value of the off-chip driver control signals OCD<0:14> in response to an initialization signal RST.

The counting controllers 121 to 135 generate a set control signal and a reset control signal, which are input to the set input terminal S and the reset input terminal R of the SR flip-flops 101 to 115.

Each of the counting controllers 121 to 135 includes each of NAND gates 141 to 155 and each of NOR gates 161 to 175. The NAND gate 141 performs a NAND operation on an increment signal INC and a power supply voltage VDD, and outputs the result to the set input terminal S of the SR flip-flop 101. The NAND gates 142 to 155 perform a NAND operation on the increment signal INC and an output signal of a previous SR flip-flop, and outputs the result to the set input terminals S of the SR flip-flops 101 to 115. The NOR gate 161 to 174 performs a NOR operation on an inverted signal of a decrement signal DEC and an output signal of a next SR flip-flop, and outputs the result to the reset input terminals R of the SR flip-flops 101 to 115. The NOR gate 175 performs a NOR operation on an inverted signal of the decrement signal DEC and the ground voltage VSS, and outputs the result to the reset input terminal R of the SR flip-flop 115.

Figure 2:
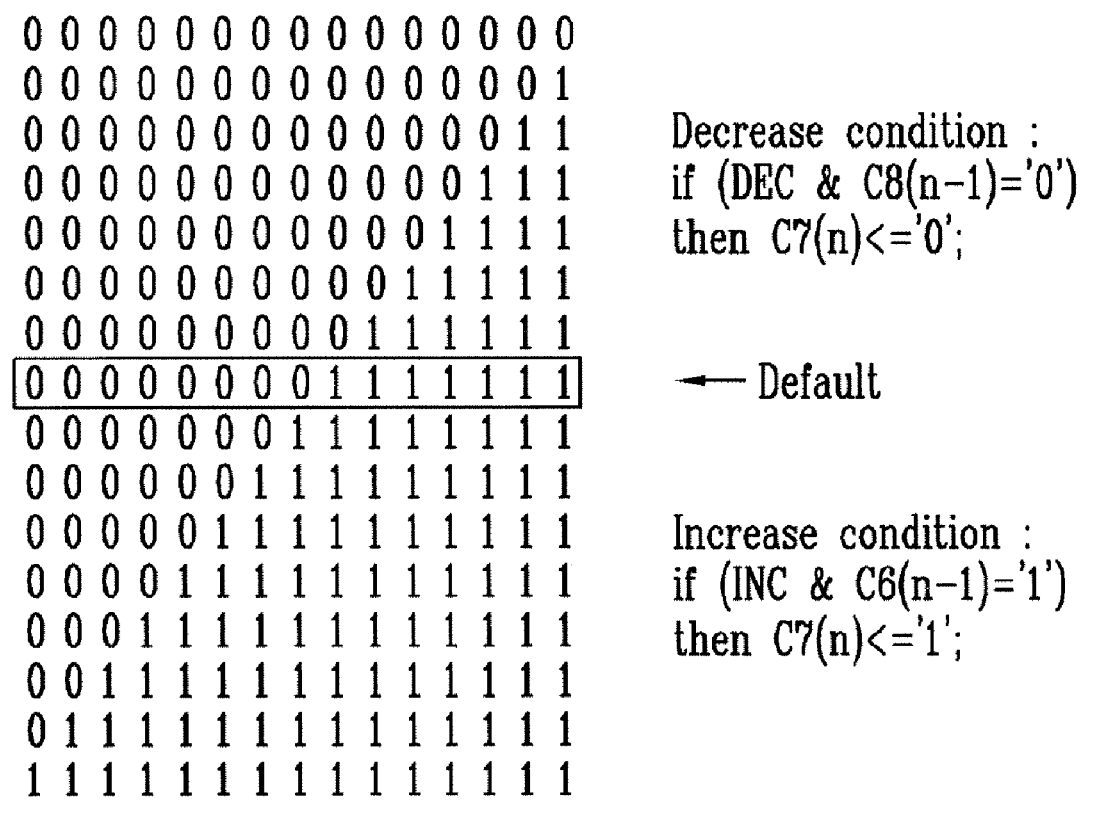

FIG. 2 is a view showing a counting method of the counter circuit for controlling the off-chip driver in the prior art.

The SR flip-flops 101 to 115 have a logic value of "000000001111111" as the initial value of the off-chip driver control signal OCD<0:14>. If the decrement signal DEC is input as high level, only an input of a reset input terminal R of a SR flip-flop in which a previous value of an upper SR flip-flop was '0' becomes a logic high level and is thus reset to '0'. On the other hand, if the increment signal INC is input as high level, only an input of a reset input terminal R of a SR flip-flop in which a previous value of a lower SR flip-flop was '1' becomes a logic high level and is thus reset to '1'.

The conventional counter circuit for controlling the off-chip driver performs binary counting using the fifteen SR flip-flops 101 to 115 and the fifteen counting controllers 121 to 135, and thus generates the five bit off-chip driver control signals OCD<0:14> by way of this binary counting. That is, the conventional counter circuit for controlling the off-chip driver has lots of components and signals, and thus has a problem in that the area of a semiconductor memory device cannot be reduced.

Furthermore, the counter circuit of this binary mode needs thirty-one SR flip-flops or sixty-three SR flip-flops if 5-bit or 6-bit off-chip driver control signals having a 32 or 64 logic value are generated. Thus, this circuit has a problem in that it occupies a significant large area of a semiconductor memory device.

SUMMARY OF THE INVENTION

Accordingly, the present invention has been made in view of the above problems, and it is an object of the present invention to provide a counter circuit for controlling an off-chip driver, which performs hexadecimal number counting using an N number of T-flip-flops.

To achieve the above object, according to a preferred embodiment of the present invention, there is provided a counter circuit for controlling an off-chip driver, including a plurality of counting means that performs a counting operation to generate N-bit (N is a natural number) off-chip driver control signals, counting stop means that stops the counting operation in response to the N-bit off-chip driver control signals, a plurality of counting control means that controls the counting operation to increase or decrease a logic value of the N-bit off-chip driver control signals, and counting operation instruction means that transfers previous (N−1)-bit off-chip driver control signals of the N-bit off-chip driver control signals for a next counting operation in response to an increment signal for increasing the counting operation and a decrement signal for decreasing the counting operation.

According to another preferred embodiment of the present invention, there is provided a counter circuit for controlling an off-chip driver, including a plurality of counting means that generates 4-bit off-chip driver control signals by performing a hexadecimal number counting operation, and a plurality of counting control means that controls the counting operation to increase or decrease a logic value of the 4-bit off-chip driver control signals.

BRIEF DESCRIPTION OF THE DRAWINGS

FIG. 2 is a view showing a counting method of a counter circuit for controlling an off-chip driver in the prior art;

DETAILED DESCRIPTION OF PREFERRED EMBODIMENTS

Now, the preferred embodiments according to the present invention will be described with reference to the accompanying drawings.

Figure 1:
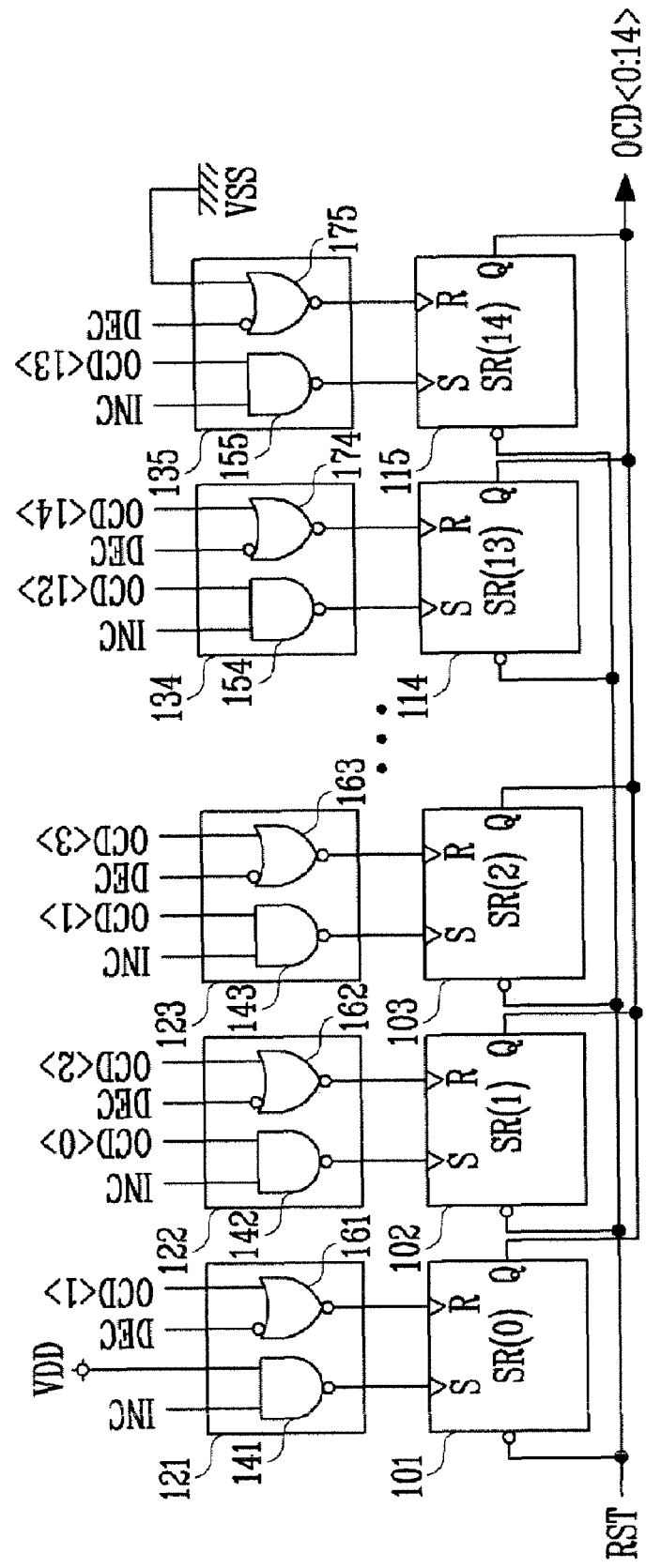
FIG. 1 is a circuit diagram of a counter circuit for controlling an off-chip driver in the prior art.
Figure 3:
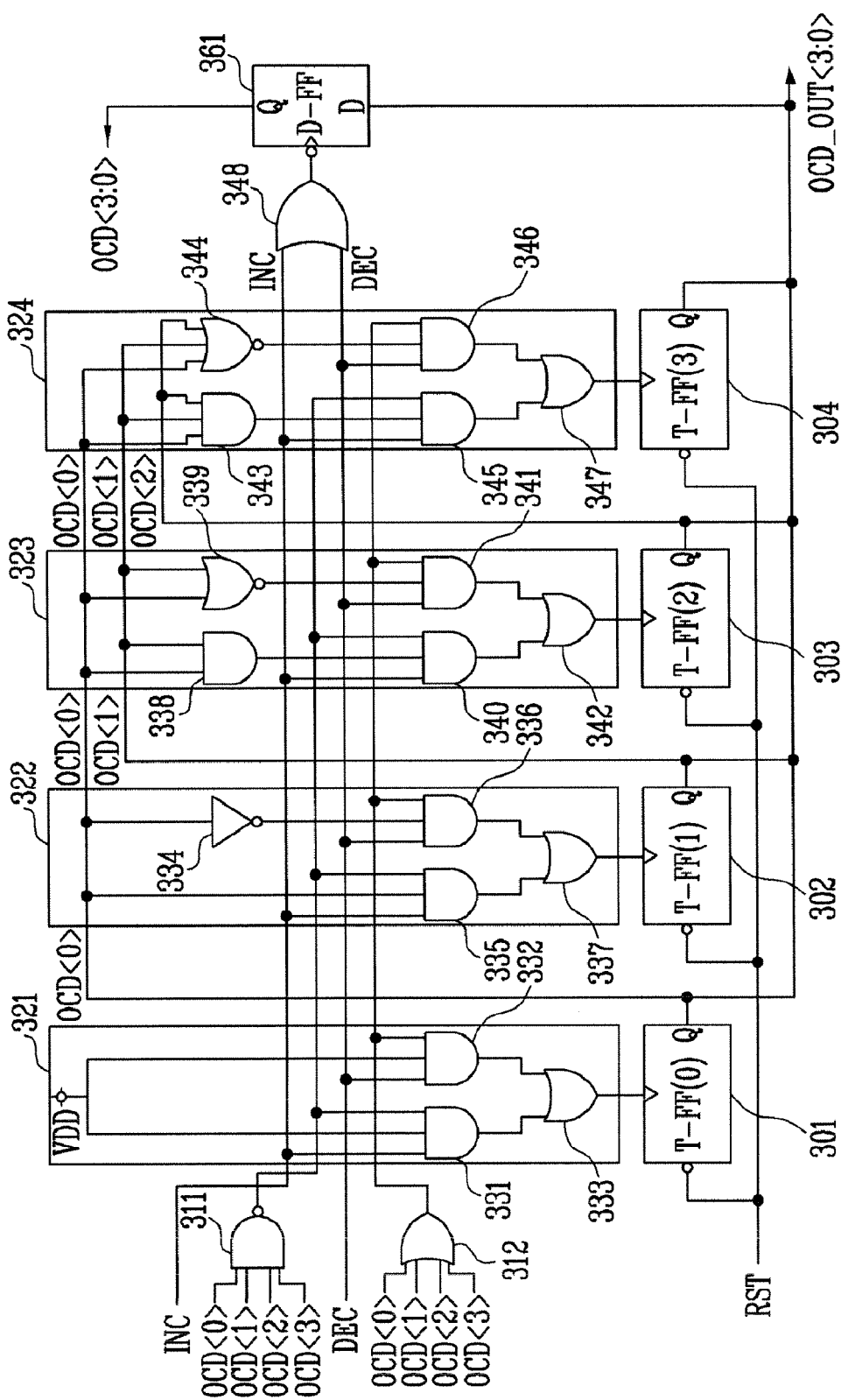
FIG. 3 is a circuit diagram of a counter circuit for controlling an off-chip driver according to a preferred embodiment of the present invention.

FIG. 3 is a circuit diagram of a counter circuit for controlling an off-chip driver according to a preferred embodiment of the present invention.

Referring to FIG. 3, the counter circuit for controlling the off-chip driver according to the present invention includes a NAND gate 311, an OR gate 312, four counting controllers 321 to 324, four T-flip-flops 301 to 304, an OR gate 348 and a D-flip-flop 361.

The NAND gate 311 performs a NAND operation on an off-chip driver control signal OCD<3:0> to output a signal that stops a logic value of the off-chip driver control signal OCD<3:0> from increasing. That is, when all the off-chip driver control signals OCD<3:0> are at a logic high level, the NAND gate 311 output a logic low level to stop the logic values of the off-chip driver control signals OCD<3:0> from increasing.

The OR gate 312 performs a OR operation on the off-chip driver control signals OCD<0:3> to output a signal that stops the logic values of the off-chip driver control signals OCD<3:0> from decreasing. That is, when all the off-chip driver control signals OCD<3:0> are at a logic low level, the OR gate 312 outputs a logic low level to stop the logic values of the off-chip driver control signals OCD<3:0> from decreasing.

The counting controllers 321 to 324 serves to increase or decrease the logic values of the off-chip driver control signals OCD<3:0> by toggling the off-chip driver control signals OCD<3:0>.

The counting controller 321 serves to toggle the off-chip driver control signals OCD<0>, and is composed of AND gates 331, 332, and an OR gate 333. The AND gate 331 performs an AND operation on an output signal of the NAND gate 311, an increment signal INC, and a power supply voltage VDD. The AND gate 332 performs an AND operation on an output signal of the OR gate 312, a decrement signal DEC, and the power supply voltage VDD. The OR gate 333 performs an OR operation on the output signals of the AND gates 331, 332 and outputs the result to the input terminal of the T-flip-flop, thereby toggling the off-chip driver control signal OCD<0>.

A counting controller 322 serves to toggle the off-chip driver control signal OCD<1>, and includes an inverter 334, AND gates 335, 336, and an OR gate 337. The inverter 334 inverts the off-chip driver control signal OCD<0>. The AND gate 335 performs an AND operation on the output signal of the NAND gate 311, the increment signal INC, and the off-chip driver control signals OCD<0>. The AND gate 336 performs an AND operation on the output signal of the OR gate 312, the decrement signal DEC, and the output signal of the inverter 334. The OR gate 337 performs an OR operation on the output signals of the AND gates 335, 336, and outputs the result to the input terminal of the T-flip-flop 302, thereby toggling the off-chip driver control signal OCD<1>.

A counting controller 323 serves to toggle the off-chip driver control signal OCD<2>, and includes an AND gate 338, a NOR gate 339, AND gates 340, 341, and an OR gate 342. The AND gate 338 performs an AND operation on the off-chip driver control signals OCD<1:0>. The NOR gate 339 performs a NOR operation on the off-chip driver control signals OCD<1:0>. The AND gate 340 performs an AND operation on an output signal of the AND gate 338, the output signal of the NAND gate 311, and the increment signal INC. The AND gate 341 performs an AND operation on an output signal of the NOR gate 339, the decrement signal DEC, and an output signal of the OR gate 312. The OR gate 342 performs a OR operation on the output signals of the AND gates 340, 341, and outputs the result to the input terminal of the T-flip-flop 303, thereby toggling the off-chip driver control signal OCD<2>.

A counting controller 324 serves to toggle the off-chip driver control signal OCD<3>, and includes an AND gate 343, a NOR gate 344, AND gates 345, 346, and an OR gate 347. The AND gate 343 performs an AND operation on the off-chip driver control signals OCD<2:0>. The NOR gate 344 performs a NOR operation on the off-chip driver control signals OCD<2:0>. The AND gate 345 performs an AND operation on an output signal of the AND gate 343, an output signal of the NAND gate 311, and the increment signal INC. The AND gate 346 performs an AND operation on an output signal of the NOR gate 344, the decrement signal DEC, and the output signal of the OR gate 312. The OR gate 347 performs a OR operation on the output signals of the AND gates 345, 346, and then outputs the result to the input terminal of the T-flip-flop 304, hereby toggling the off-chip driver control signal OCD<3>.

The counting controller 321 to 324 outputs a logic high level when the increment signal INC is at a logic high level, a previous off-chip driver control signal of a T-flip-flop is at a logic high level, and the output signal of the NAND gate 311 is at a logic high level, thus toggling the off-chip driver control signals OCD<3:0>. Further, the counting controllers 321 to 324 output a logic high level when the decrement signal DEC is at a logic high level, a previous off-chip driver control signal of a T-flip-flop is at a logic low level, and the output signal of the OR gate 312 is at a logic high level, thus toggling the off-chip driver control signals OCD<3:0>.

The T-flip-flops 301 to 304 output the off-chip driver control signals OCD<3:0> for controlling the off-chip driver. The off-chip driver control signals OCD<3:0> are toggled at the moment when the output signals of the counting controller 321 to 324 become high level, so that its logic value increases or decreases. Further, the T-flip-flops 301 to 304 has a logic value of '0111' as an initial value of the off-chip driver control signals OCD<3:0> in response to the initialization signal RST. The logic value of '0111' is a value corresponding to 7 of a hexadecimal number.

The OR gate 348 outputs a low level only when both the increment signal INC and the decrement signal DEC are low level.

The D-flip-flop 361 receives the off-chip driver control signals OCD_OUT<3:0> only when the output signal of the OR gate 348 is at a low level, i.e., a standby state, and transfers the off-chip driver control signals OCD<3:0> for performing the counting operation. The D-flip-flop 361 has logic values of the off-chip driver control signals OCD_OUT<3:0> when the output signal of the OR gate 348 is high level.

Figure 4:
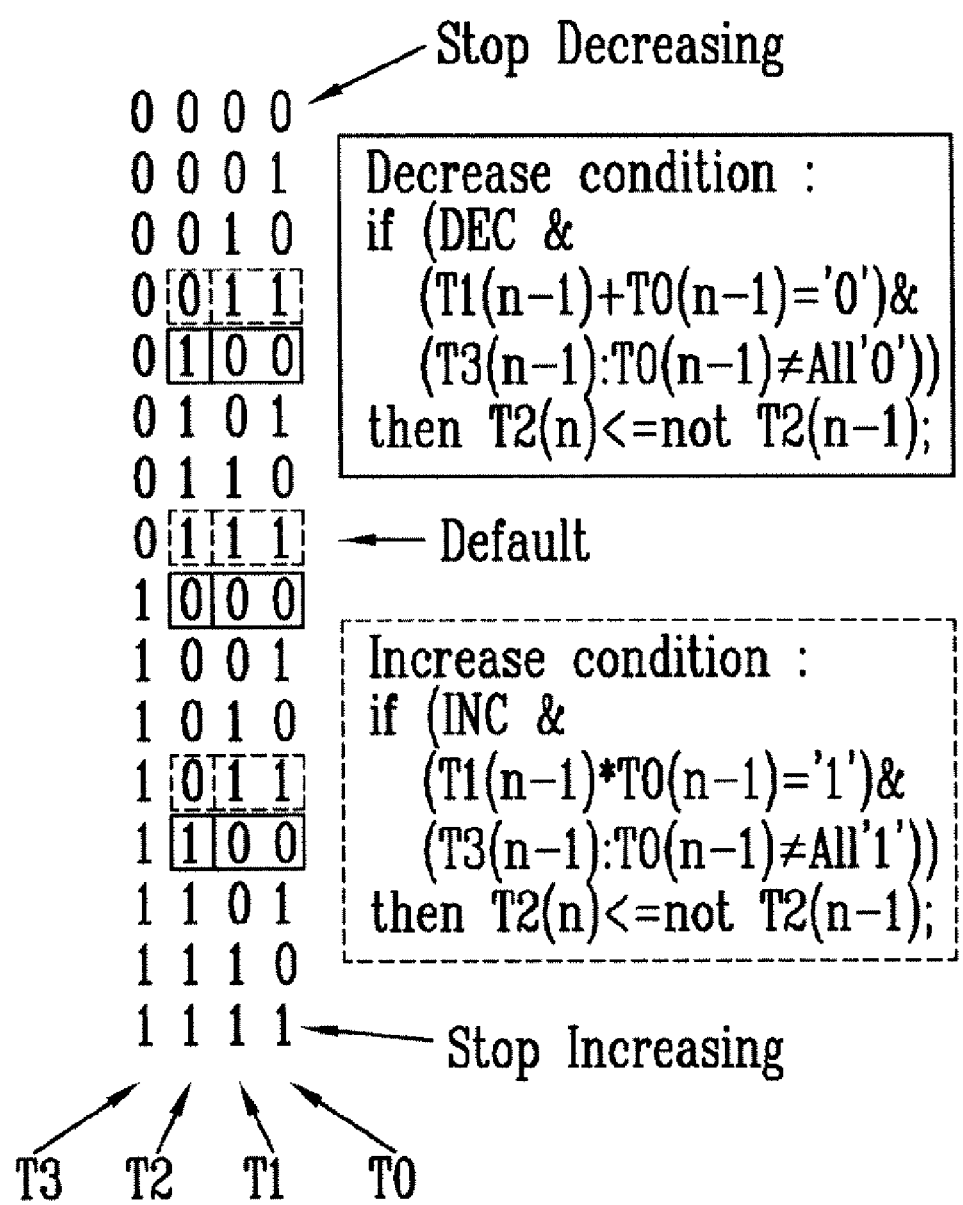
FIG. 4 is a view showing a counting method of a counter circuit for controlling an off-chip driver according to a preferred embodiment of the present invention.

FIG. 4 is a view showing a counting method of a counter circuit for controlling an off-chip driver according to a preferred embodiment of the present invention.

The counting method of the counter circuit for controlling the off-chip driver will now be described in detailed with reference to FIGS. 3 and 4.

A case where a counting increment operation is performed will be first described as an example.

When both the increment signal INC and the decrement signal DEC are at a low level, i.e., in a standby state, the off-chip driver control signals OCD_OUT<3:0> have a logic value of "1011", and the off-chip driver control signals OCD<3:0> for a next counting operation also have a logic value of "1011". In this state, if the increment signal INC is input as a high level, the output signal of the NAND gate 311 becomes high level since the off-chip driver control signals OCD<3:0> are '1011'. Then, the NAND gates 331, 335 and 340 output a high level, the NAND gates 332, 336 and 341 output a low level, the OR gates 333, 337 and 342 output a high level, the off-chip driver control signals OCD_OUT<1: 0> of the T-flip-flop 301 and 302 are toggled from "1" to "0", and the off-chip control signal OCD_OUT<2> toggles from "0" to "1". Since the off-chip driver control signals OCD_OUT<2:0> have a value of "011", the NOR gate 347 outputs a low level, and the off-chip driver control signal OCD_OUT<3> of the T-flip-flop 304 does not toggle but keeps the logic value of "1" as it is. That is, the logic values of the off-chip driver control signals OCD_OUT<3:0> increase from "1011" to "1100". At this time, since the D-flip-flop 361 has the increment signal INC of a high level, it has the logic value of "1011" of the previous off-chip driver control signals OCD_OUT<3:0>. Thereafter, if the increment signal INC becomes a low level, the T-flip-flops 301 to 304 stop the counting operation. The D-flip-flop 361 transfers the increased logic value "1100" of the off-chip driver control signals OCD_OUT<3:0> as the logic value of the off-chip driver control signals OCD<3:0> for a next counting operation in order to prepare for a next operation.

A case where the T-flip-flops 301 to 304 perform a decrement operation will be below described as an example.

If the increment signal INC and the decrement signal DEC are at a low level, the off-chip driver control signals OCD_OUT<3:0> have a logic value of "1011", and the off-chip driver control signals OCD<3:0> for a next counting operation also have a logic value of "1011". In this state, if the decrement signal DEC is input as a high level, the output signal of the NAND gate 312 becomes high level since the off-chip driver control signals OCD<3:0> are '1011'. Then, the NAND gate 331 outputs a low level, the NAND gate 332 outputs a high level, and the OR gate 333 outputs a high level, so that the off-chip driver control signal OCD_OUT<0> of the T-flip-flop 301 toggles from "1" to "0". Since the off-chip driver control signals OCD<3:1> have a logic value of "101", the NOR gates 337, 342 and 347 output a low level, and the off-chip driver control signals OCD_OUT<3:1 > of the T-flip-flops 302, 303 and 304 do not toggle but keep the logic value of "101". That is, the logic value of the off-chip driver control signals OCD_OUT<3:0> decreases from "1011" to "1010". At this time, since the D-flip-flop 361 has the decrement signal DEC of the high level, it has the logic value of "1011" of the previous off-chip driver control signal OCD_OUT<3:0>. Thereafter, if the decrement signal DEC becomes low level, the T-flip-flops 301 to 304 stop the counting operation, and the D-flip-flop 361 transfers the decreased logic value "1010" of the off-chip driver control signals OCD_OUT<3: 0> as the logic value of the off-chip driver control signals OCD<3:0> for a next counting operation in order to prepare for a next operation.

At this time, in the case where the decrement signal DEC is input as a high level, if previous off-chip driver control signals of all the T-flip-flops are at a logic level of '0', the decrement signal DEC is disabled. In the case where the increment signal INC is input as a high level, if previous off-chip driver control signals of all the T-flip-flops are at a logic level of '1', the increment signal INC is disabled. If this situation comes up, the T-flip-flops 301 to 304 no longer perform the counting operation.

If the counter circuit for controlling the off-chip driver performs hexadecimal number counting operation in this manner, the counter circuit that generates the 16-bit off-chip driver control signal by performing binary counting through the conventional fifteen SR flip-flops can be replaced with the counter circuit that generates the 5-bit off-chip driver control signal through the four T-flip-flops. It is therefore possible to implement a counter circuit for controlling an off-chip driver that can perform the same operation as that of the prior art using less components and output signals.

Furthermore, invention the counter circuit for controlling the off-chip driver according to a preferred embodiment of the present performs hexadecimal number counting by adding one or two T-flip-flops, and can thus generate a 5-bit or 6-bit off-chip driver control signal having 32 or 64 logic values.

Figure 5:
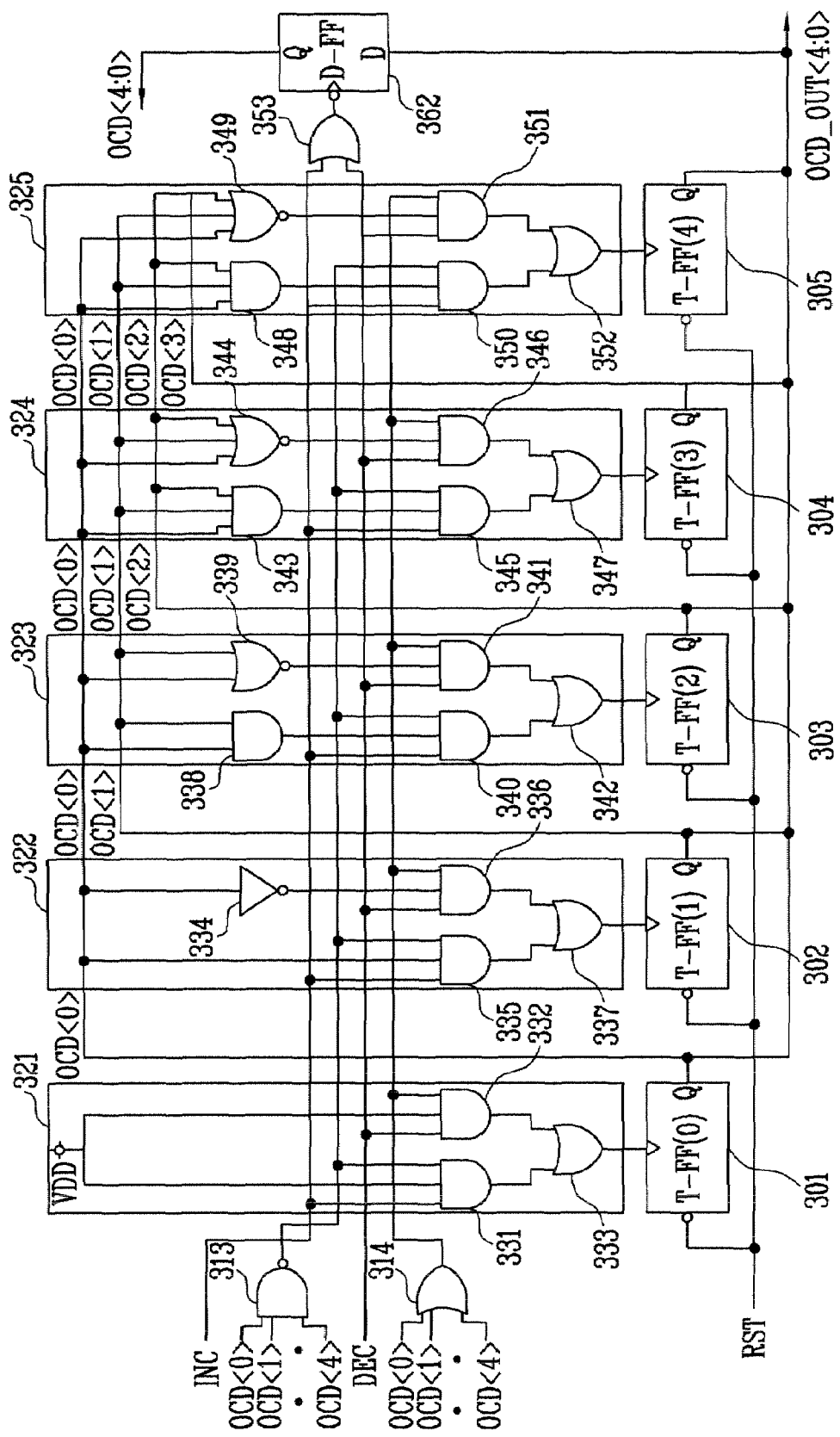
FIG. 5 is a circuit diagram of a counter circuit for controlling an off-chip driver according to another preferred embodiment of the present invention.

FIG. 5 is a circuit diagram of a counter circuit for controlling an off-chip driver according to another preferred embodiment of the present invention.

The counter circuit for controlling the off-chip driver shown in FIG. 5 has the same construction as that of FIG. 3 except that a T-flip-flop 305 and a counting controller 326 are further included, a NAND gate 313 performs a NAND operation on off-chip driver control signals OCD<4:0> of T-flip-flops 301 to 305, a NOR gate 314 perform a NOR operation on the off-chip driver control signals OCD<4:0> of the T-flip-flops 301 to 305, and a D-flip-flop 362 receives the off-chip driver control signals OCD_OUT<4:0> and transfers them as the off-chip driver control signals OCD<4: 0> for the next counting operation. Thus, reference can be made to the description of FIG. 3 for description of FIG. 5. The counter circuit for controlling the off-chip driver of FIG. 5 perform hexadecimal number counting using the five T-flip-flops 301 to 305, and thus outputs 5-bit off-chip driver control signals OCD<4:0> having a logic value of 32.

As described above, according to the present invention, since hexadecimal number counting is performed using less flip-flop than that of the prior art, a 4-bit off-chip driver control signal having a logic value of 16 can be generated. Furthermore, since hexadecimal number counting is performed by adding one or two flip-flop, 5-bit or 6-bit off-chip driver control signals having a logic value of 32 or 64 can be generated.

Although the foregoing description has been made with reference to the preferred embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A counter circuit for controlling an off-chip driver, comprising:
   a plurality of counting means that performs a counting operation to generate N-bit (N is a natural number) off-chip driver control signals;
   counting stop means that stops the counting operation in response to the N-bit off-chip driver control signals;
   a plurality of counting control means that controls the counting operation to increase or decrease a logic value of the N-bit off-chip driver control signals; and
   counting operation instruction means that transfers previous off-chip driver control signals of the N-bit off-chip driver control signals for a next counting operation in response to an increment signal for increasing the counting operation and a decrement signal for decreasing the counting operation.

2. The counter circuit as claimed in claim 1, wherein the counting stop means comprises:
   first counting stop means that stops an increment operation of the counting operation when all the N-bit off-chip driver control signals are at a high level; and second counting stop means that stops a decrement operation of the counting operation when all the N-bit off-chip driver control signals are at a low level.

3. The counter circuit as claimed In claim 1, wherein the counting operation instruction means comprises:
   a counting operation instruction unit that informs whether to perform a next counting operation in response to the increment signal and the decrement signal; and
   a latch circuit that transfers the previous off-chip driver control signals in response to the output signal of the counting operation instruction unit.

4. The counter circuit as claimed in claim 1, wherein the plurality of the counting means is composed of first to fifth T-flip-flops that generate a 4-bit off-chip driver control signal by performing hexadecimal number counting.

5. The counter circuit as claimed in claim 1, wherein the plurality of the counting means is composed of first to fifth T-flip-flops that generate a 5-bit off-chip driver control signal by performing hexadecimal number counting.

6. The counter circuit as claimed in claim 1, wherein the plurality of the counting control means controls the counting operation in response to output signals of the counting stop means, the previous off-chip driver control signals, the increment signal and the decrement signal.

7. The counter circuit as claimed in claim 6, wherein the plurality of the counting control means controls the logic value of the N-bit off-chip driver control signals to increase when the increment signal is at a high level, all the previous off-chip driver control signals are at a high level, and the output signal of the counting stop means are at a high level, and controls the logic value of the N-bit off-chip driver control signals to decrease when the decrement signal is at a high level, all the previous off-chip driver control signals are at a low level, and the output signal of the counting stop means are at a high level.

8. The counter circuit as claimed in claim 6, wherein the plurality of the counting control means comprises:
   first counting control means that toggles a first off-chip driver control signal by combining the output signals of the counting stop means, the increment signal, the decrement signal, and a first power supply voltage;
   second counting control means that toggles a second off-chip driver control signal by combining the output signals of the counting stop means, the increment signal, the decrement signal, and the first off-chip driver control signal;
   third counting control means that toggles a third off-chip driver control signal by combining the output signals of the counting stop means, the increment signal, the decrement signal and the first and second off-chip driver control signals; and
   fourth counting control means that toggles a fourth off-chip driver control signal by combining the output signals of the counting stop means, the increment signal, the decrement signal, and the first to third off-chip driver control signals.

9. The counter circuit as claimed in claim 8, further comprising fifth counting control means that toggles a fifth off-chip driver control signal by combining the output signals of the counting stop means, the increment signal, the decrement signal, and the first to fourth off-chip driver control signals.

10. A counter circuit for controlling an off-chip driver, comprising:
    a plurality of counting means that generates 4-bit off-chip driver control signals by performing a hexadecimal number counting operation;
    a plurality of counting control means that controls the counting operation to increase or decrease a logic value of the 4-bit off-chip driver control signals;
    counting stop means that stops the counting operation in response to the 4-bit off chip driver control signals; and
    counting operation instruction means that informs whether to perform a next counting operation in response to an increment signal for increasing the counting operation and a decrement signal for decreasing the counting operation.

11. The counter circuit as claimed in claim 10, further comprising:
    a latch circuit that transfers previous off-chip driver control signals of the 4-bit off-chip driver control signals in response to an output signal of the counting operation instruction means.

12. The counter circuit as claimed in claim 10, wherein the counting stop means comprises:
    first counting stop means that stops an increment operation of the counting operation when all of the 4-bit off-chip driver control signals are at a high level; and
    second counting stop means that stops a decrement operation of the counting operation when all the 4-bit off-chip driver control signals are at a low level.

13. The counter circuit as claimed in claim 10, wherein the plurality of the counting control means controls the counting operation in response to output signals of the counting stop means, the previous off-chip driver control signals, the increment signal, and the decrement signal.

14. The counter circuit as claimed in claim 13, wherein the plurality of the counting control means controls the logic value of the 4-bit off-chip driver control signals to increase when the increment signal is at a high level, all the previous off-chip driver control signals of the 4-bit off-chip driver control signals are at a high level, and the output signal of the counting stop means are at a high level, and controls the logic value of the 4-bit off-chip driver control signals to decrease when the decrement signal is at a high level, all the previous off-chip driver control signals are at a low level, and the output signal of the counting stop means are at a high level.

15. The counter circuit as claimed in claim 13, wherein the plurality of the counting control means comprises:
    first counting control means that toggles s a first off-chip driver control signal by combining the output signals of the counting stop means, the increment signal, the decrement signal, and a first power supply voltage;
    second counting control means that toggles a second off-chip driver control signal by combining the output signals of the counting stop means, the increment signal, the decrement signal, and the first off-chip driver control signal;
    third counting control means that toggles a third off-chip driver control signal by combining the output signals of the counting stop means, the increment signal, the decrement signal, and the first and second off-chip driver control signals; and
    fourth counting control means that toggles a fourth off-chip driver control signal by combining the output signals of the counting stop means, the increment signal, the decrement signal, and the first to third off-chip driver control signals.

16. The counter circuit as claimed in claim 15, further comprising fifth counting control means that toggles a fifth off-chip driver control signal by combining the output signals of the counting stop means, the increment signal, the decrement signal, and the first to fourth off-chip driver control signals.

17. The counter circuit as claimed in claim 10, wherein the plurality of the counting means is composed of first to fourth T-flip-flops that generate a 4-bit off-chip driver control signal.

18. The counter circuit as claimed in claim 10, wherein the plurality of the counting means is composed of first to fifth T-flip-flops that generate a 5-bit off-chip driver control signal.

* * * * *

UNITED STATES PATENT AND TRADEMARK OFFICE
CERTIFICATE OF CORRECTION

PATENT NO. : 7,289,591 B2  Page 1 of 1
APPLICATION NO. : 11/160832
DATED : October 30, 2007
INVENTOR(S) : Kang Youl Lee It is certified that error appears in the above-identified patent and that said Letters Patent is hereby corrected as shown below:

In the Claims:

At Column 7, line 24, "signal" should be -- signal, --.

Signed and Sealed this

Seventeenth Day of June, 2008

JON W. DUDAS
*Director of the United States Patent and Trademark Office*